(12) United States Patent
Grutzeck et al.

(10) Patent No.: US 11,307,404 B2
(45) Date of Patent: Apr. 19, 2022

(54) MICROMECHANICAL MICROMIRROR ARRAY AND CORRESPONDING OPERATING METHOD

(71) Applicant: Robert Bosch GmbH, Stuttgart (DE)

(72) Inventors: Helmut Grutzeck, Kusterdingen (DE);
Timo Schary, Aichtal-Neuenhaus (DE);
Joerg Muchow, Munich (DE); Philip Kaupmann, Gundelfingen (DE)

(73) Assignee: Robert Bosch GmbH, Stuttgart (DE)

( * ) Notice: Subject to any disclaimer, the term of this patent is extended or adjusted under 35 U.S.C. 154(b) by 128 days.

(21) Appl. No.: 16/652,210

(22) PCT Filed: Oct. 18, 2018

(86) PCT No.: PCT/EP2018/078609
§ 371 (c)(1),
(2) Date: Mar. 30, 2020

(87) PCT Pub. No.: WO2019/077063
PCT Pub. Date: Apr. 25, 2019

(65) Prior Publication Data
US 2020/0249467 A1    Aug. 6, 2020

(30) Foreign Application Priority Data

Oct. 19, 2017    (DE) .................... 102017218670.4

(51) Int. Cl.
*G02B 26/08*    (2006.01)
*B81B 3/00*    (2006.01)
(Continued)

(52) U.S. Cl.
CPC ........ *G02B 26/0858* (2013.01); *B81B 3/0021* (2013.01); *G02B 26/101* (2013.01);
(Continued)

(58) Field of Classification Search
CPC .............. G02B 26/0858; G02B 26/101; G02B 26/085; B81B 3/0021; B81B 2201/042;
(Continued)

(56) References Cited

U.S. PATENT DOCUMENTS

| 6,198,565 B1 | 3/2001 | Iseki et al. |
| 2002/0034026 A1* | 3/2002 | Orcutt .................. G02B 26/101 |
| | | 359/877 |

(Continued)

FOREIGN PATENT DOCUMENTS

| CN | 104011583 A | 8/2014 |
| CN | 104204899 A | 12/2014 |

(Continued)

OTHER PUBLICATIONS

International Search Report for PCT/EP2018/078609, dated Jan. 25, 2019.

(Continued)

*Primary Examiner* — Euncha P Cherry
(74) *Attorney, Agent, or Firm* — Norton Rose Fulbright US LLP; Gerard Messina

(57) ABSTRACT

A micromechanical micromirror array including a frame including a cutout, a micromirror device suspended on the frame in the area of the cutout in a first plane, a first pivoting vane device suspended on the frame protruding into the area of the cutout, coupled to the micromirror device via a first spring device, a second pivoting vane device suspended on the frame protruding into the area of the cutout, coupled to the micromirror device via a second spring device, a first drive device for deflecting the first pivoting vane device along a first axis, perpendicular to the first plane, and a second drive device for the antiphase deflection of the second pivoting vane device along the first axis.

15 Claims, 11 Drawing Sheets

(51) Int. Cl.
*G02B 26/10* (2006.01)
*H01L 41/09* (2006.01)

(52) U.S. Cl.
CPC ........ *H01L 41/09* (2013.01); *B81B 2201/042* (2013.01); *B81B 2203/0163* (2013.01)

(58) Field of Classification Search
CPC .... B81B 2203/0163; B81B 2203/0109; B81B 3/0043; H01L 41/09; G01S 7/4817
USPC ...................................................... 359/224.1
See application file for complete search history.

(56) References Cited

U.S. PATENT DOCUMENTS

| 2007/0068308 A1 | 3/2007 | Greywall |
| 2007/0171496 A1 | 7/2007 | Jeong et al. |
| 2015/0357897 A1 | 12/2015 | Muchow et al. |
| 2016/0286185 A1* | 9/2016 | Oohara ................ G02B 26/101 |

FOREIGN PATENT DOCUMENTS

| CN | 104570334 A | 4/2015 |
| CN | 105103031 A | 11/2015 |
| CN | 206494724 U | 9/2017 |
| EP | 3086548 A1 | 10/2016 |

OTHER PUBLICATIONS

Takayuki Iseki et al., "Shrinking Design of a MEMS Optical Scanner Having Four Torsion Beams and Arms," Sensors and Actuators A: Physical, vol. 164, No. 1-2, 2010, pp. 95-106, XP055539857.

\* cited by examiner

MICROMECHANICAL MICROMIRROR ARRAY AND CORRESPONDING OPERATING METHOD

FIELD

The present invention relates to a micromechanical micromirror array and a corresponding operating method.

BACKGROUND INFORMATION

Although arbitrary micromechanical components are also applicable, the present invention and the problem underlying it are explained with reference to micromechanical micromirror arrays for motor vehicles.

Micromirror arrays including piezoelectric drives are used, for example, in motor vehicle headlights or in LIDAR systems. In this case, it is desirable to use a compact design to scan a preferably large area via deflection of the micromirror. The piezoelectric drives used utilize the piezoelectric effect. Once a voltage is applied to a piezoelectric layer, it becomes deformed.

A micromechanical micromirror array including four torsion bars and torsion arms, which are deformable via a piezoelectric drive and which deflect as a result a coupled micromirror, is described in Sensors and Actuators A 164 (2010) pages 95-106, T. Iseki, et al.

SUMMARY

The present invention provides an example micromechanical micromirror array, and an example corresponding operating method.

Preferred refinements are described herein.

A feature of the present invention is the extension of the first and of the second pivoting vane device along the direction of the third axis beyond the second axis as a rotational axis. In this way, a lever effect may be achieved, which results in larger rotations of the micromirror device with relatively small deflections of the first and of the second pivoting vane device.

According to one preferred example refinement according to the present invention, the first pivoting vane device is suspended in a first area of the frame in the first plane, extends along the direction of the third axis beyond the second axis and is connected at its end to a first extension of the micromirror device via the first spring device, the second pivoting vane device being suspended in the first plane in a second area of the frame situated opposite the first area, extending along the direction of the third axis beyond the second axis and being connected at its end to a second extension of the micromirror device via the second spring device, the first extension and the second extension being offset in the same direction along the third axis with respect to the second axis. A symmetrical deflection of the micromirror device may thus be implemented.

According to a further preferred refinement of the present invention, the first extension extends in a straight line and the second extension extends at an angle. In this way, the first and second pivoting vane devices may be nested along the third axis in a space-saving manner.

According to a further preferred refinement of the present invention, the first pivoting vane device is suspended in the first plane in a first area of the frame, extends at an angle along the direction of the second axis and the third axis, extends along the direction of the third axis beyond the second axis and is connected at its end to a first extension of the micromirror device via the first spring device, the second pivoting vane device being suspended in the first plane in a second area of the frame offset laterally relative to the first area, extending at an angle along the direction of the second axis and the third axis, extending along the direction of the third axis beyond the second axis and being connected at its end to a second extension of the micromirror device via the second spring device, the first extension and the second extension being offset relative to the second axis in the same direction along the third axis, and the micromirror device being suspended on the frame on a second side opposite the first side via a torsion bar. In this way, particularly large rotations of the micromirror device over the length of the first and second pivoting vane devices may be achieved.

According to a further preferred refinement of the present invention, a first torsion device for rotating the first pivoting vane device about the second axis in the first area is suspended in the first plane between the first area of the frame and the first pivoting vane device, and a second torsion device for rotating the second pivoting vane device about the second axis in the second area is suspended in the first plane between the second area of the frame and the first pivoting vane device. In this way, the rotation of the micromirror device may be further increased as the result of a torsion.

According to a further preferred refinement of the present invention, the first pivoting vane device and the second pivoting vane device are each coupled on a first side of the micromirror device and on an opposite second side of the micromirror device. This allows for a particularly robust symmetrical coupling.

According to a further preferred refinement of the present invention, the first pivoting vane device and the second pivoting vane device encompass the micromirror device in each case in a forked manner, the first pivoting vane device being suspended on the frame in the first plane via a fifth spring device, extending along the direction of the third axis on both sides of the micromirror device beyond the second axis and being connected at their ends to the micromirror device via the first spring device, and the second pivoting vane device being suspend on the frame in the first plane via a sixth spring device, extending along the direction of the third axis on both sides of the micromirror device beyond the second axis and being connected at their ends to the micromirror device via the sixth spring device. This allows the first and second pivoting vane device to be virtually floatingly suspended.

According to a further preferred refinement of the present invention, the micromechanical micromirror array is fitted with a third pivoting vane device suspended on the frame protruding into the area of the cutout, which is coupled to the micromirror device via a third spring device, with a fourth pivoting vane device suspended on the frame protruding into the area of the cutout, which is coupled to the micromirror device via a fourth spring device, with a third drive unit for deflecting the third pivoting vane device along a first axis, which is situated perpendicularly to the first plane, and a fourth drive unit for the antiphase deflection of the fourth pivoting vane device along the first axis, the micromirror device being resiliently rotatable out of the first plane via the antiphase deflection of the third pivoting vane device and the fourth pivoting vane device about the second axis, and the third pivoting vane device and the fourth pivoting vane device being designed in such a way that they extend beyond the second axis on a second side of the micromirror device situated opposite the first side along the direction of the third axis situated essentially perpendicularly to the second axis. In this way, a fourfold drive may be implemented.

According to a further preferred refinement of the present invention, the third pivoting vane device and the fourth pivoting vane device, third spring device, fourth spring device, third drive unit and fourth drive unit are situated symmetrically relative to the first side and coupled on a second side of the micromirror device opposite the first side. In this way, a symmetrical fourfold drive may be implemented.

According to a further preferred refinement of the present invention, the first drive unit and/or the second drive unit include(s) a piezoelectric drive unit, a piezoelectric strip conductor device being mounted on the first pivoting vane device and on the second pivoting vane device. This is a robust, easily manufacturable drive.

According to a further preferred refinement of the present invention, the first drive unit and/or the second drive unit include(s) an electromagnetic drive unit, which includes an external magnetic field generation device and a coil device, the coil device being mounted on the first pivoting vane device and on the second pivoting vane device and on the frame. This allows an electromagnetic drive to be designed in a space-saving manner.

According to a further preferred refinement of the present invention, a sensor device including a plurality of piezoelectric resistors mounted on respective springs, which are attached between the frame and the first pivoting vane device and the frame and the second pivoting device, are provided for detecting the resilient rotation of the micromirror device about the second axis out of the first plane. This allows a sensor device to be integrated in a space-saving manner.

According to a further preferred refinement of the present invention, a first cap substrate including a cutout provided in the area of the micromirror device is provided on a rear side of the frame and a second cap substrate including an optical window in the area of the micromirror device is situated on the front side of the frame. This allows a protective packaging to be manufactured at the wafer level.

BRIEF DESCRIPTION OF THE DRAWINGS

Further features and advantages of the present invention are explained below based on specific embodiments with reference to the figures.

DETAILED DESCRIPTION OF EXAMPLE EMBODIMENTS

Figure 1A:
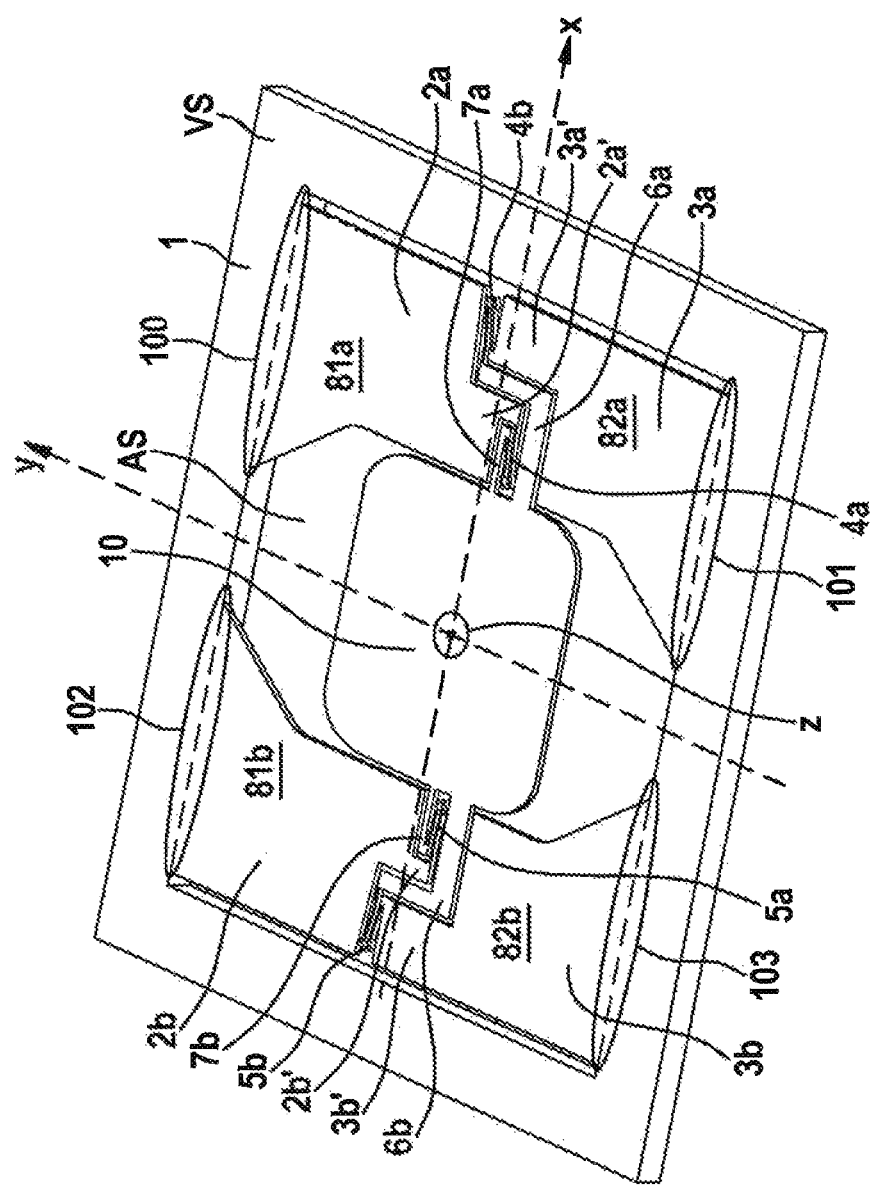
FIGS. 1a) through 1e) show a micromechanical micromirror array according to a first specific embodiment of the present invention.

In the figures, identical reference numerals refer to identical or functionally identical elements.

FIGS. 1a through 1e) show a micromechanical micromirror array according to a first specific embodiment of the present invention.

A coordinate system orthogonal in this specific embodiment is formed by axes x, y and z which, however, may generally also differ from the orthogonal shape.

Reference numeral 1 in FIGS. 1a) through 1e) refers to a frame of the micromechanical micromirror array, which is manufactured, for example, of silicon via corresponding structuring processes. VS in this case is the front side of frame 1 and RS is the rear side of frame 1 (see FIG. 1c).

Frame 1 includes a cutout AS, in which a micromirror device 10 is suspended on frame 1 in the xy-plane.

A first pivoting vane device 2a suspended in area 100 on frame 1 protruding into the area of cutout AS extends also in the idle state in the xy-plane and is connected via a first spring device 4a to a first linear extension 7a of the micromirror device 10. In this case, first pivoting vane device 2a includes an area 2a', which extends along the y-axis on a first side of the micromirror device 10 beyond the y-axis. First linear extension 7a of micromirror device 10 is correspondingly applied to micromirror device 10 along the y-axis offset relative to the x-axis. A first piezoelectric drive device 81a is mounted on first pivoting vane device 2a on front side VS, with the aid of which first pivoting vane device 2a is deflectable along the z-axis out of the xy-plane.

A second pivoting vane device 3a suspended in opposite area 101 on frame 1 protruding into the area of cutout AS also extends in the idle state in the xy-plane and is connected via a second spring device 4b to a first angled extension 6a of micromirror device 10. In this case, second pivot vane device 3a includes an area 3a', which extends along the y-axis on the first side of micromirror device 10 beyond the y-axis, specifically, in the direction opposite area 2a'. The second pivoting vane device 3a is designed axially symmetrically relative to first pivoting vane device 2a with respect to the x-axis. First angled extension 6a of micromirror device 10 is applied to micromirror device 10 along the y-axis in the same direction further offset relative to the x-axis than first linear extension 7a. A second piezoelectric drive device 82a is mounted on second pivoting vane device 3a on front side VS, with the aid of which second pivoting vane device 3a is deflectable along the z-axis out of the xy-plane.

A third pivoting vane device 2b suspended in area 102 of frame 1, protruding into the area of cutout AS extends also in the idle state in the xy-plane and is connected via a third spring device 5a to a second linear extension 7 of micromirror device 10. Third pivoting vane device 2b in this case includes an area 2b', which extends along the y-axis on a second side of micromirror device 10 beyond the y-axis, the second side being situated opposite the first side. Third pivoting vane device 2b is designed axially symmetrically relative to first pivoting vane device 2a with respect to the y-axis. Second linear extension 7b of micromirror device 10 is correspondingly applied to micromirror device 10 along the y-axis offset relative to the x-axis. A third piezoelectric drive device 81b is mounted on third pivoting vane device 2b on front side VS, with the aid of which third pivoting vane device 2b is deflectable along the z-axis out of the xy-plane.

A fourth pivoting vane 3b suspended on frame 1 in opposite area 101, protruding into the area of cutout AS extends also in the idle state in the xy-plane and is connected to a second angled connection 6b of micromirror device 10 via a fourth spring device 5b. Fourth pivoting vane device 3b in this case includes an area 3b', which extends along the y-axis on the second side of micromirror device 10 beyond the y-axis, specifically, in a direction opposite to area 2b'. Fourth pivoting vane device 3b is designed axially symmetrically relative to third pivoting vane device 2b with respect to the x-axis. Second angled extension 6b of micromirror device 10 is applied to micromirror device 10 along the y-axis in the same direction further offset relative to the x-axis than the second linear extension 7b. A fourth piezoelectric drive device 82b is mounted on fourth pivoting vane device 3b on front side VS, with the aid of which fourth pivoting vane device 3b is deflectable along the z-axis out of the xy-plane.

Figure 1B:
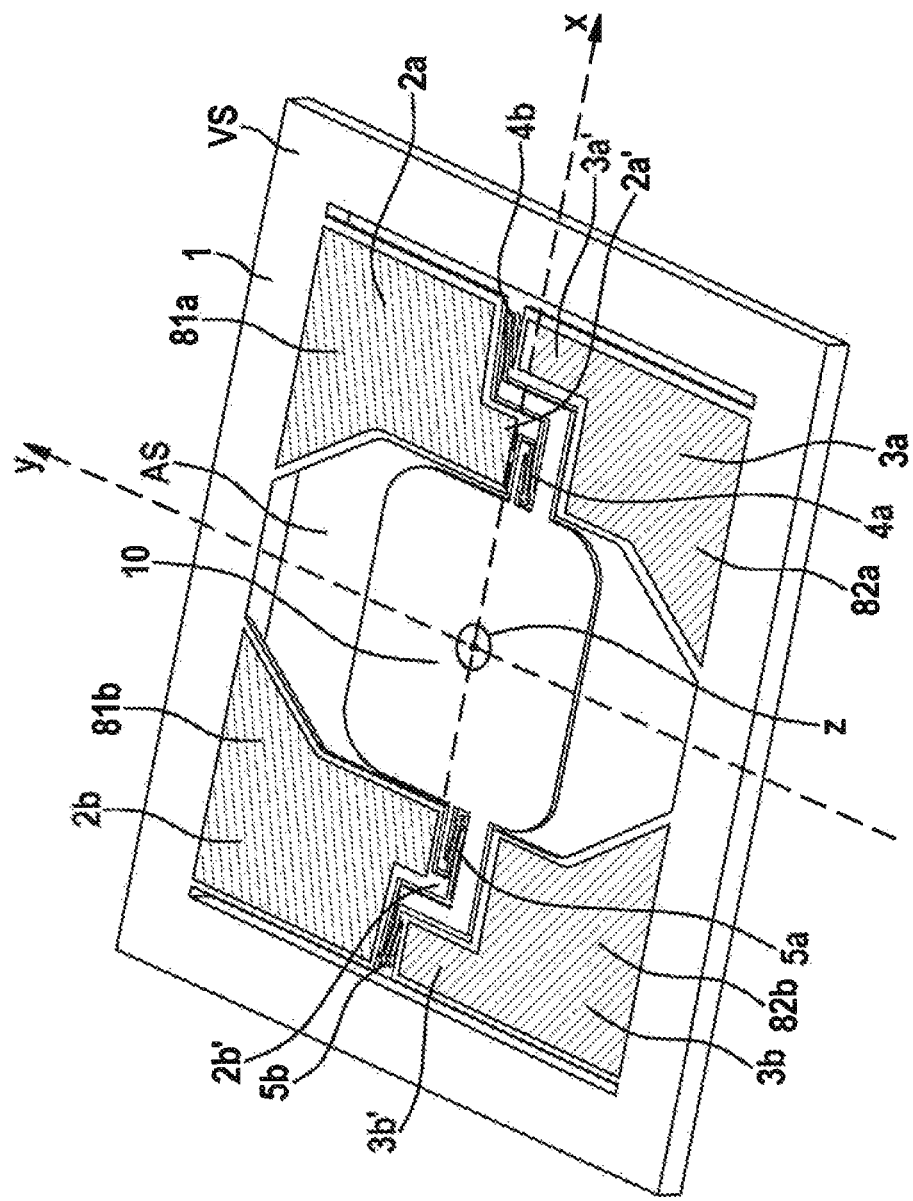

As illustrated in FIG. 1b) by the hatchings of first and third piezoelectric drive devices 81a, 81b, first pivoting vane device 2a and third pivoting vane device 2b are deflected by first and third piezoelectric drive devices 81a and 81b in phase along the z-axis.

As illustrated in FIG. 1b) by the hatchings of second and fourth piezoelectric drive device 82a, 82b, second pivoting vane device 3a and fourth pivoting vane device 3b are also deflected in phase along the z-axis with the aid of second piezoelectric drive device 82a and fourth piezoelectric drive device 82b. In this case, first and third pivoting vane devices 2a, 2b are deflected antiphase along the z-axis compared to second and fourth pivoting vanes 3a, 3b.

As a result of the antiphase deflection of first and third pivoting vane devices 2a, 2b and of second and fourth pivoting vane devices 3a, 3b, micromirror device 10 is resiliently rotatable out of the xy-plane about the x-axis as the rotational axis.

Figure 1C:
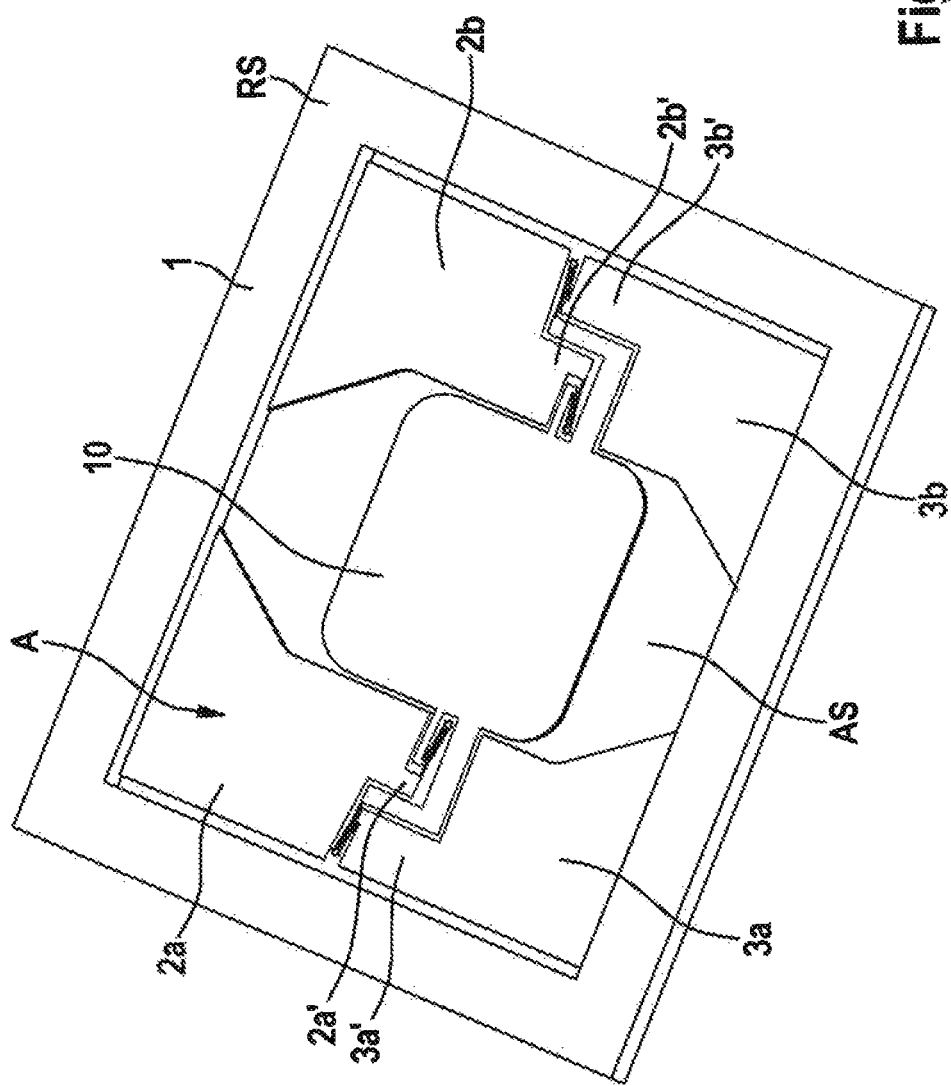

With reference to FIG. 1c), it is apparent that micromirror device 10 and first through fourth pivoting vane devices 2a, 3a, 2b, 3b as well as extensions 7a, 7b, 6a, 6b and springs 4a, 4b, 5a, 5b have a smaller thickness than frame 1 surrounding them. This may be achieved procedurally, for example, by etching out a cavity A on rear side RS of frame 1.

Figure 1D:
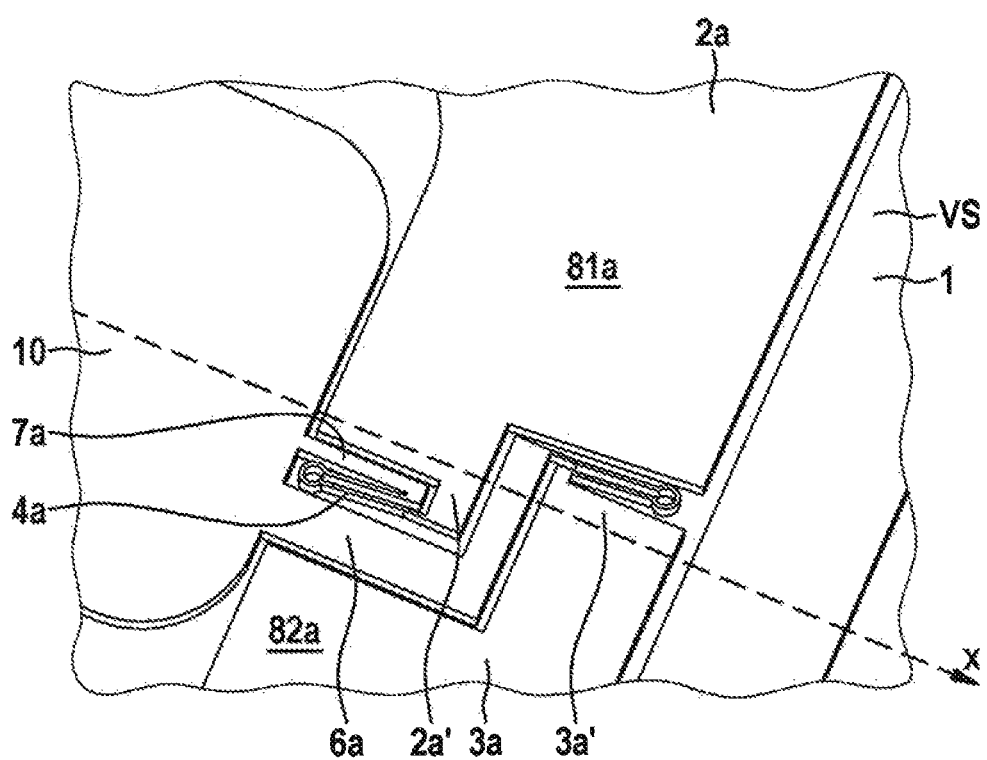

FIG. 1d) shows an enlarged illustration of the coupling of first and second pivoting vane devices 2a, 3a via springs 4a, 4b to extensions 7a, 6a of micromirror device 10.

Figure 1E:
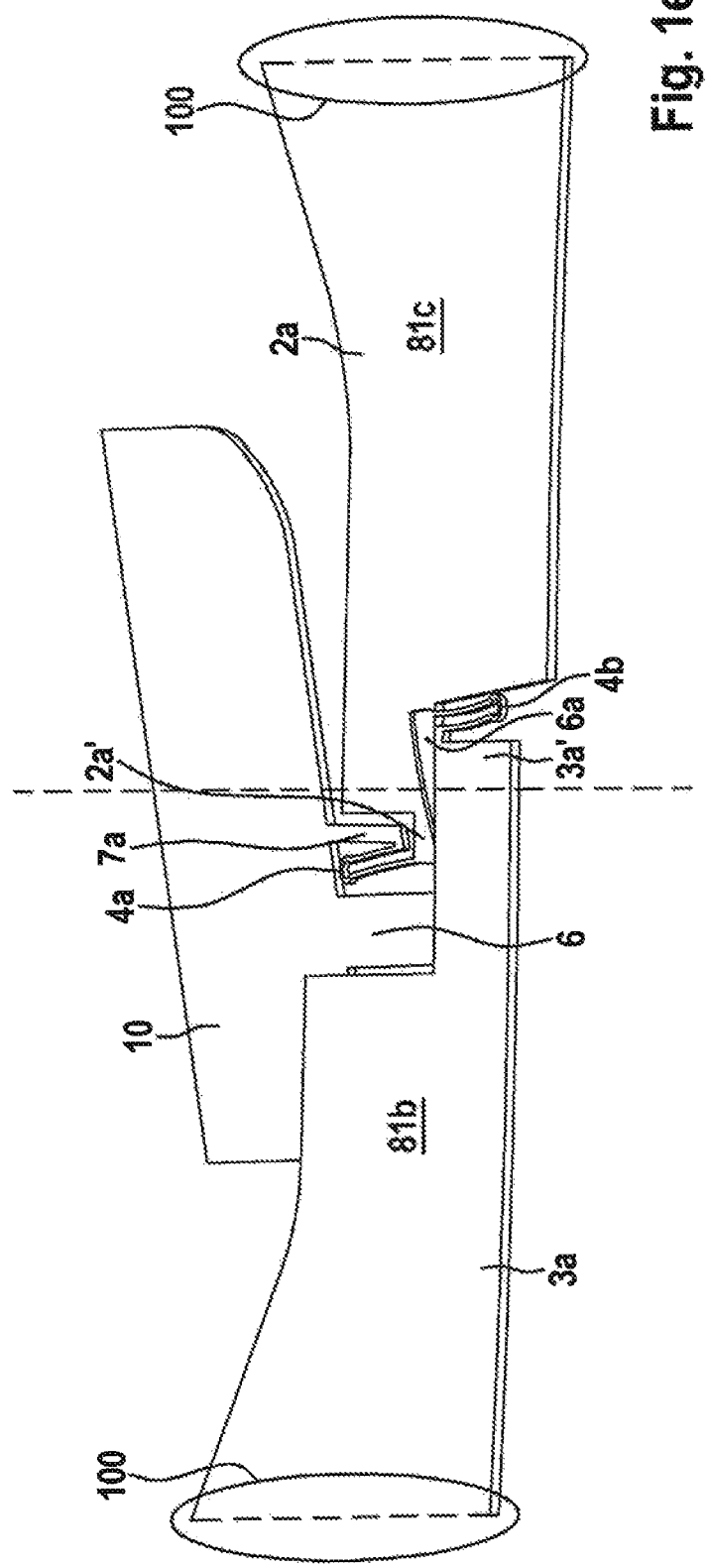

FIG. 1e) shows the deflected state of first pivoting vane device 2a and of second pivoting vane device 3a in opposite directions along the z-axis, as a result of which micromirror device 10 is rotated.

Due to the fact that first through fourth pivoting vane devices 2a, 3a, 2b, 3b are extended along the y-axis as the rotational axis, relatively large deflections of micromirror device 10 may be effected with relatively small deformations of pivoting vane devices 2a, 3a, 2b, 3b.

Figure 2:
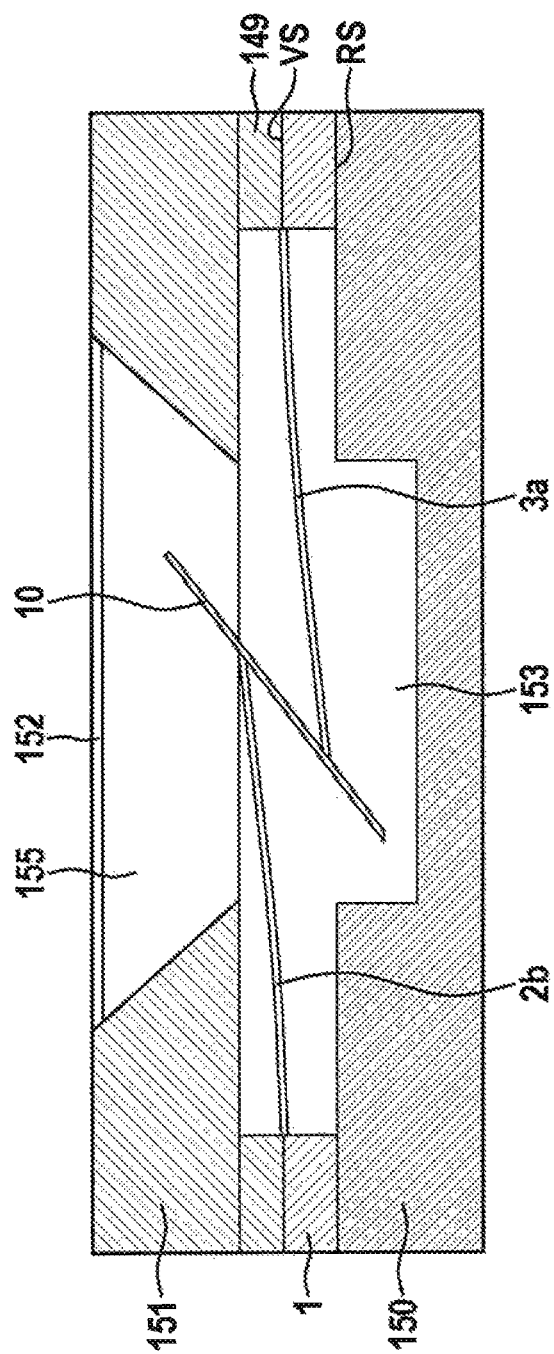
FIG. 2 shows the micromechanical micromirror array according to the first specific embodiment of the present invention including a capping.

FIG. 2 shows the micromechanical micromirror array according to the first specific embodiment of the present invention including a capping.

According to FIG. 2, a first cap substrate 150 including a cutout 153 provided in the area of micromirror device 10 is provided on rear side RS of frame 1. Micromirror device 10 may thus be deflected into cutout 153.

An annular intermediate substrate 149 and a second cap substrate 141 situated on top thereof are provided on front side VS of frame 1, second cap substrate 151 including an optical window 152 in the area of micromirror device 10. Optical window 152 is situated above a through-opening 155 of second cap substrate 151, micromirror device 10 also being moved into through-opening 155 during the deflection.

Figure 3:
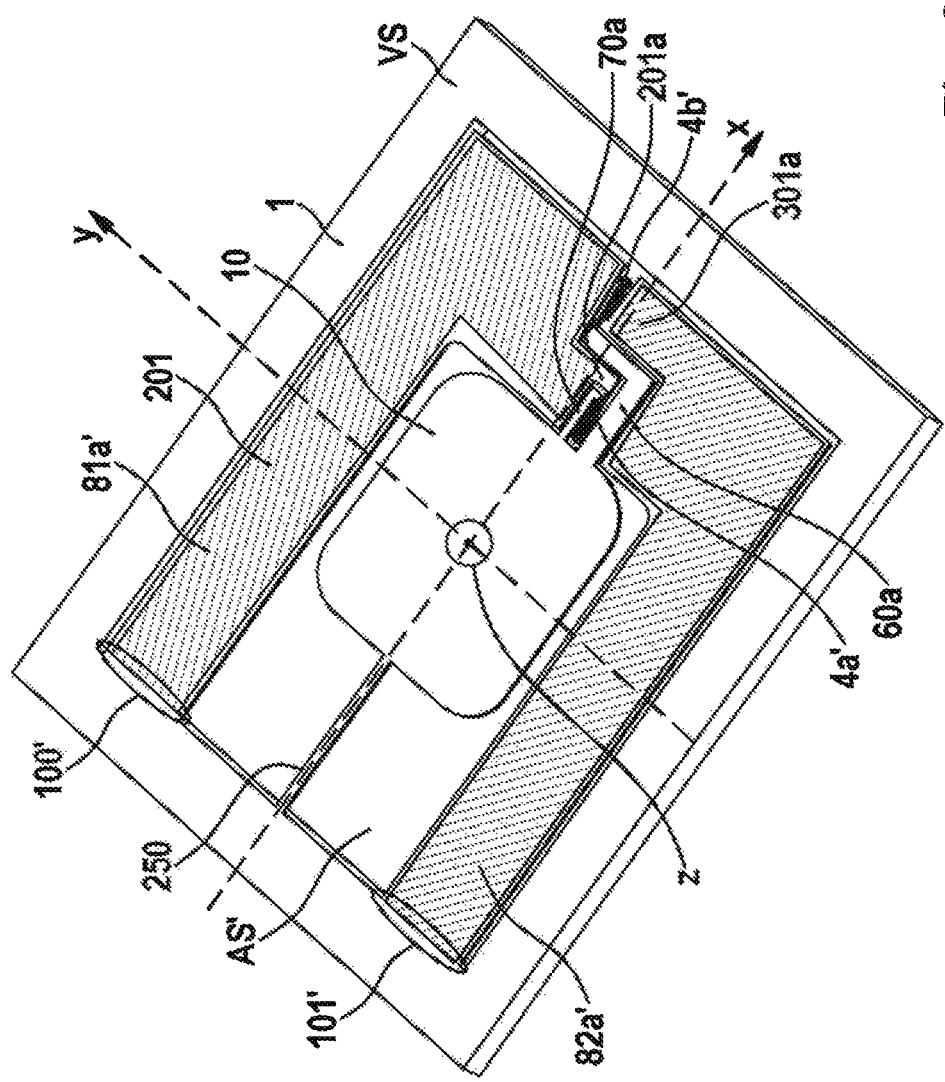
FIG. 3 shows a micromechanical micromirror array according to a second specific embodiment of the present invention.

FIG. 3 shows a micromechanical micromirror array according to a second specific embodiment of the present invention.

The first pivoting vane device in the second specific embodiment bears reference numeral 201 and is coupled to frame 1 in area 100'. A first piezoelectric drive device 81a' is provided on first pivoting vane device 201 on front side VS.

The second pivoting vane device bears reference numeral 301 and includes second piezoelectric drive device 82a' mounted on front side VS. Second pivoting vane device 301 is coupled to frame 1 in area 101'.

First pivoting vane device 201 and second pivoting vane device 301 are designed axially symmetrically relative to the x-axis and protrude in parallel into cutout AS'.

First pivoting vane device 201 extends angularly along the x-axis and the y-axis, the extension along the y-axis also being guided beyond the x-axis as the rotational axis as in the first specific embodiment in area 201a. First pivoting vane device 201 is connected at its end on a first side via a first spring device 4a' to a first linear extension 70a of micromirror device 10, first linear extension 70a being offset relative to the x-axis along the y-axis as in the first specific embodiment.

Second pivoting vane device 301, like first pivoting vane device 201, is also suspended in the xy-plane and extends at an angle along the x-axis and the y-axis, the extension along the y-axis going beyond the x-axis as the rotational axis in area 301a. Second pivoting vane device 301 is connected at its end via a second spring device 4b' to a first angled extension 60a of micromirror device 10. Both first extension 70a as well as second extension 60a are offset relative to the x-axis in the same direction along the y-axis, the angled extension 60a being further offset than linear extension 70a relative to the x-axis.

Thus, the coupling of first and second pivoting vane device 201, 301 to the micromirror device is similar to the first specific embodiment and only the extension of first and second pivoting vane 201, 301 differ.

On a second side situated opposite the first side, micromirror device 10 is suspended via a torsion bar 250 to frame 1, torsion bar 250 extending along the x-axis.

As indicated by corresponding hatchings, first pivoting vane device 201 and second pivoting vane device 301 are also deflectable antiphase along the z-axis via first and second piezoelectric drive device 81a' 82a', as a result of which a rotatability of micromirror device 10 about the x-axis is achievable.

Torsion bar 250 serves as a simple swivel joint and may, if necessary, also be folded multiple times in order to reduce the torsion stiffness. In the second specific embodiment, first pivoting vane device 201 and second pivoting vane device 301 may be designed longer and thus may deflect more strongly compared to the first specific embodiment.

Figure 4:
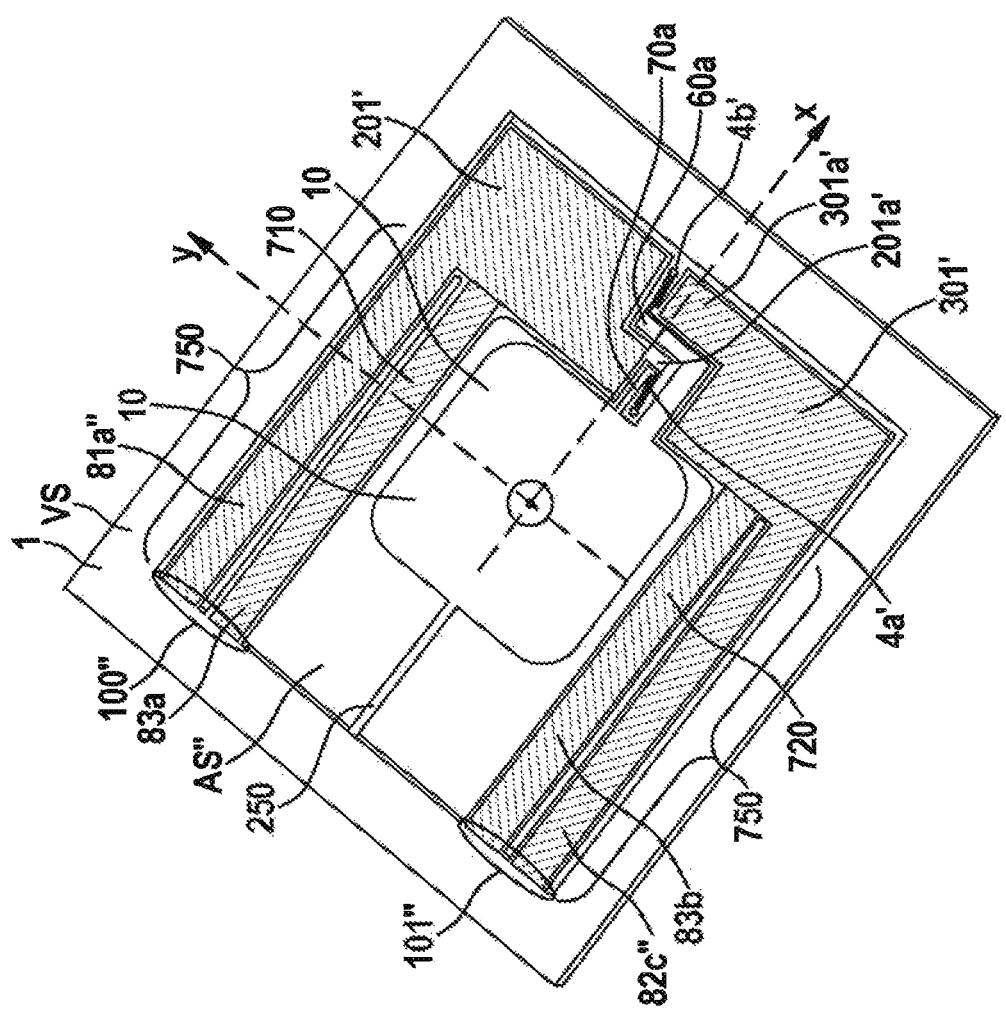
FIG. 4 shows a micromechanical micromirror array according to a third specific embodiment of the present invention.

FIG. 4 shows a micromechanical micromirror array according to a third specific embodiment of the present invention.

In the third specific embodiment, the first pivoting vane device bears reference numeral 201' and the second pivoting vane device bears reference number 301', the areas extended via the x-axis being identified by reference numerals 201a' and 301a', respectively. Areas 100" and 101" refer to the coupling areas of first pivoting vane device 201' and reference numeral 301' to the second pivoting vane device on frame 1.

First piezoelectric drive device 81a" is mounted on front side VS on first pivoting vane device 201', and second piezoelectric drive device 82a" is mounted on front side VS on second pivoting vane device 301. The coupling to micromirror device 10 and the extension of first pivoting vane device 201' and of second pivoting vane device 301' in cutout AS" is similar to the second specific embodiment.

In addition to the second specific embodiment, a first torsion device 710 on which a third piezoelectric drive device 83a is mounted is provided next to and spaced apart from first pivoting vane device 201', and a second torsion device 720 on which a fourth piezoelectric drive device 83b is mounted is provided next to and spaced apart from second pivoting vane device 301'.

Opposite polarizations, if they are applied to third and fourth piezoelectric drive device 83a, 83b of first torsion device 710 and of second torsion device 720 as they are to first and second piezoelectric drive device 81a", 82a" of first pivoting vane device 201' and second pivoting vane device 301', cause a contraction in area 750 and thus a further rotation and thus a further deflection of first and second pivoting vane devices 201', 301' along the z-axis and thus a stronger rotation of the micromirror device about the x-axis.

Figure 5:
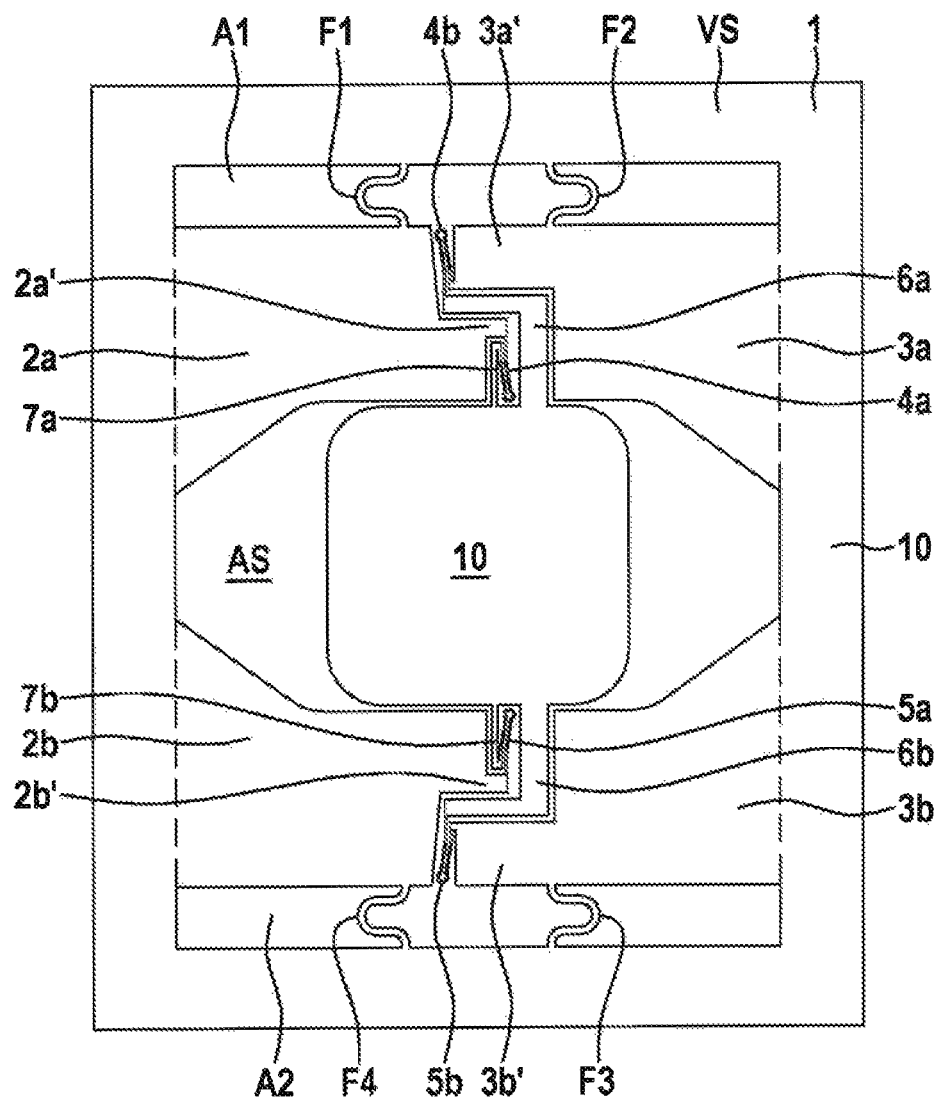
FIG. 5 shows a micromechanical micromirror array according to a fourth specific embodiment of the present invention.

FIG. 5 shows a micromechanical micromirror array according to a fourth specific embodiment of the present invention.

The general structure in the third specific embodiment according to FIG. 5 is similar to the first specific embodiment.

In addition to first and second pivoting vane device 2a, 3a and to third and fourth pivoting vane device 2b, 3b, a respective additional cutout A1 and A2 are provided, within which springs F1, F2 and F3, F4 are clamped. Via springs F1, F2 and F3, F4 and a piezoelectric resistor device R1 through R4 applied thereto (cf. FIGS. 6a) through 6c)), it is possible to detect the deflections of pivoting vane devices 2a, 3a and 2b, 3b, and thus the deflection of micromirror device 10 from the xy-plane about the x-axis, as is explained below with reference to FIGS. 6a) through 6c).

Figure 6C:
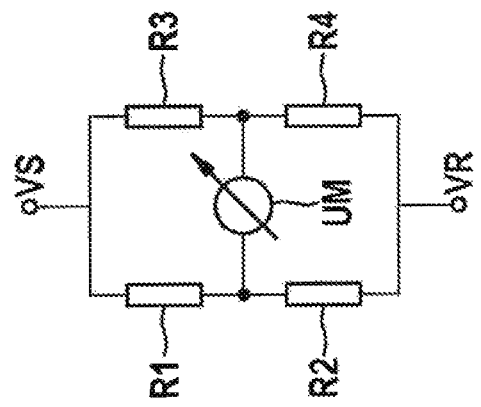
FIGS. 6a) through 6c) show detailed illustrations of the sensor device of the fourth specific embodiment of the present invention.
Figure 6A:
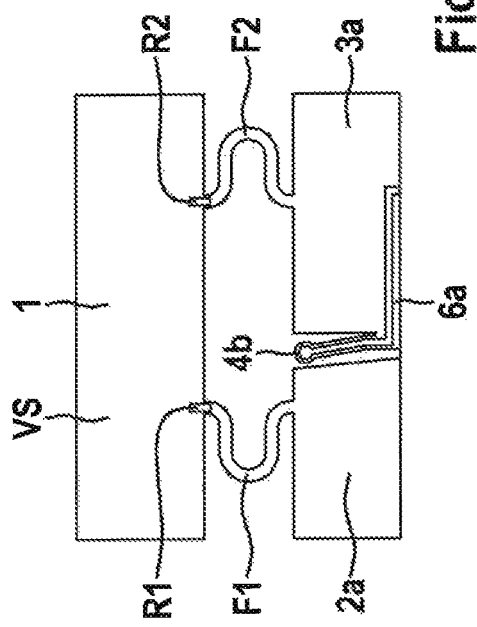
Figure 6B:
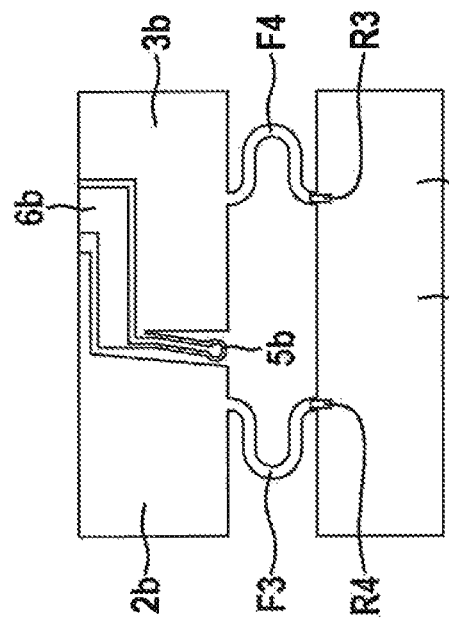

FIGS. 6a) through 6c) are detailed illustrations of the sensor device of the fourth specific embodiment of the present invention.

As shown in FIGS. 6a) through 6c), respective piezoelectric resistive resistors R1, R2, R3, R4 are mounted on springs F1 through F4 in their end areas on frame 1.

With the aid of a strip conductor device not depicted, it is possible to interconnect piezoelectric resistors R1 through R4 with a Wheatstone measuring bridge, to which external potentials VS, VR may be applied and the bridge voltage may be tapped with the aid of a voltage detection device UM, as is schematically depicted in FIG. 6c).

Figure 7:
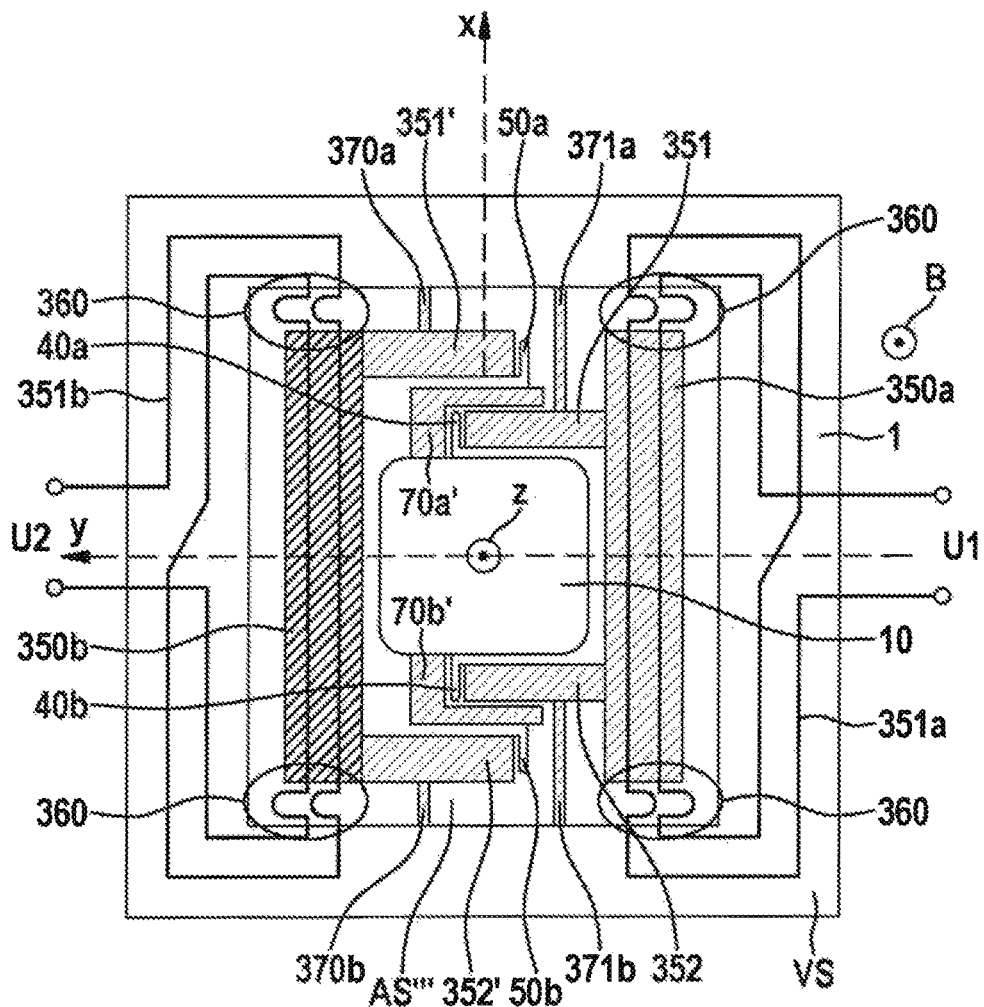
FIG. 7 shows a micromechanical micromirror array according to a fifth specific embodiment of the present invention.

FIG. 7 shows a micromechanical micromirror array according to a fifth specific embodiment of the present invention.

In the fourth specific embodiment, reference numeral 350a refers to a first pivoting vane device and reference numeral 350b refers to a second pivoting vane, which protrude into cutout AS'".

First pivoting vane device 350a and second pivoting vane device 350b are each coupled in a forked manner to micromirror device 10 on a first side of micromirror device 10 and on an opposite second side of micromirror device 10. In this case, reference numerals 351, 352 refer to forked extension areas of first pivoting vane device 350a and reference numerals 351', 352' refer to forked extension areas of second pivoting vane device 350b.

First pivoting vane device 350a is suspended in the y-plane via a spring device 371a, 371b on opposite sides on frame 1, extends along the y-axis on both sides of micromirror device 10 beyond the x-axis as the rotational axis and is directly connected at the ends of extension areas 351, 352 via spring devices 40a, 40b to micromirror device 10 offset relative to the x-axis.

Second pivoting vane device 350b is suspended on opposite sides on frame 1 in the xy-plane, extends along the y-axis on both sides of micromirror device 10 via the x-axis as the rotational axis and is connected at the end of extension areas 351', 352' via spring devices 50a, 50b to a respective angled extension 70a', 70b' of micromirror device 10, the angled extensions 70a', 70b' being applied to micromirror device 10 along the y-axis further offset relative to the x-axis than springs 40a, 40b. They extend along the y-axis in the opposite direction beyond the x-axis.

In the fourth specific embodiment, an electromagnetic drive rather than a piezoelectric drive is provided, which includes an external magnetic field generation device B and a coil device. The coil device includes a first coil 351a, which is guided over frame 1 and over first pivoting vane device 350a. Limp areas 360 of coil device 351a are provided above cutout AS'".

The coil device includes a second coil 351b, which is guided over frame 1 and second pivoting vane device 350b. Limp areas 360 of coil device 351b are provided above cutout AS'".

By applying opposite voltages U1 and U2 to first and to second pivoting vane devices 351a, 351b, it is possible to deflect first and second pivoting vane devices 350a, 350b in opposite directions along the z-axis and thus to achieve a resilient rotation of micromirror device 10 about the x-axis.

The present invention, although it has been described with reference to preferred exemplary embodiments, is not limited thereto. The materials and topologies cited are, in particular, only exemplary and are not limited to the examples explained.

Although the present invention has been explained with reference to micromechanical micromirror arrays for motor vehicles, the application is, of course, not limited thereto. Further application examples are projection units for near-field scanners, particle detectors, LED deflection units, etc.

What is claimed is:

1. A micromechanical micromirror array, comprising:
   a frame which includes a cutout;
   a micromirror device suspended in a first plane on the frame in an area of the cutout;
   a first pivoting vane device suspended on the frame in the area of the cutout, the first pivoting vane device being coupled to the micromirror device via a first spring device;
   a second pivoting vane device suspended on the frame, protruding into the area of the cutout, the second pivoting vane being coupled to the micromirror device via a second spring device;
   a first drive device configured to deflect the first pivoting vane device along a first axis which is situated perpendicular to the first plane; and
   a second drive device configured to an antiphase deflection of the second pivoting vane device along the first axis;
   wherein the micromirror device is resiliently rotatable out of the first plane by the antiphase deflection of the first pivoting vane device and of the second pivoting vane device about a second axis; and wherein the first pivoting vane device and the second pivoting vane device extend beyond the second axis on a first side of the micromirror device along a direction of a third axis situated perpendicularly to the second axis, wherein the first pivoting vane device is suspended in a first area of the frame in the first plane, extends along a direction of the third axis beyond the second axis, and is connected at its end to a first extension of the micromirror device via the first spring device.

2. A micromechanical micromirror array, comprising:
a frame which includes a cutout;
a micromirror device suspended in a first plane on the frame in an area of the cutout;
a first pivoting vane device suspended on the frame in the area of the cutout, the first pivoting vane device being coupled to the micromirror device via a first spring device;
a second pivoting vane device suspended on the frame, protruding into the area of the cutout, the second pivoting vane being coupled to the micromirror device via a second spring device;
a first drive device configured to deflect the first pivoting vane device along a first axis which is situated perpendicular to the first plane; and
a second drive device configured to an antiphase deflection of the second pivoting vane device along the first axis;
wherein the micromirror device is resiliently rotatable out of the first plane by the antiphase deflection of the first pivoting vane device and of the second pivoting vane device about a second axis; and
wherein the first pivoting vane device and the second pivoting vane device extend beyond the second axis on a first side of the micromirror device along a direction of a third axis situated perpendicularly to the second axis,
wherein the first pivoting vane device is suspended in a first area of the frame in the first plane, extends along a direction of the third axis beyond the second axis, and is connected at its end to a first extension of the micromirror device via the first spring device, and the second pivoting vane device is suspended in the first plane in a second area of the frame situated opposite the first area, extending along the direction of the third axis beyond the second axis, and is connected at its end to a second extension of the micromirror device via the second spring device, the first extension and the second extension being offset in the same direction along the third axis with respect to the second axis.

3. The micromechanical micromirror array as recited in claim 2, wherein the first extension extends in a straight line and the second extension extends at an angle.

4. A micromechanical micromirror array, comprising:
a frame which includes a cutout;
a micromirror device suspended in a first plane on the frame in an area of the cutout;
a first pivoting vane device suspended on the frame in the area of the cutout, the first pivoting vane device being coupled to the micromirror device via a first spring device;
a second pivoting vane device suspended on the frame, protruding into the area of the cutout, the second pivoting vane being coupled to the micromirror device via a second spring device;

a first drive device configured to deflect the first pivoting vane device along a first axis which is situated perpendicular to the first plane; and
a second drive device configured to an antiphase deflection of the second pivoting vane device along the first axis;
wherein the micromirror device is resiliently rotatable out of the first plane by the antiphase deflection of the first pivoting vane device and of the second pivoting vane device about a second axis; and
wherein the first pivoting vane device and the second pivoting vane device extend beyond the second axis on a first side of the micromirror device along a direction of a third axis situated perpendicularly to the second axis,
wherein the first pivoting vane device is suspended in the first plane in a first area of the frame, extends at an angle along a direction of the second axis and the third axis, extends along a direction of the third axis beyond the second axis, and is connected at its end to a first extension of the micromirror device via the first spring device, and the second pivoting vane device is suspended in the first plane in a second area of the frame, which is laterally offset relative to the first area, extends at an angle along the direction of the second axis and the third axis, extends along the direction of the third axis beyond the second axis, and is connected at its end to a second extension of the micromirror device via the second spring device, the first extension and the second extension being offset in the same direction along the third axis with respect to the second axis, and the micromirror device being suspended on the frame on a second side opposite the first side via a torsion bar.

5. The micromechanical micromirror array as recited in claim 4, wherein the first extension extends in a straight line and the second extension extends at an angle.

6. The micromechanical micromirror array as recited in claim 4, wherein a first torsion device configured to rotate the first pivoting vane device about the second axis in the first area is suspended in the first plane between the first area of the frame and the first pivoting vane device, and a second torsion device configured to rotate the second pivoting vane device about the second axis in the second area being suspended in the first plane between the second area of the frame and the first pivoting plane device.

7. The micromechanical micromirror array as recited in claim 1, wherein the first pivoting vane device and the second pivoting vane device are each coupled on a first side of the micromirror device and on an opposite second side of the micromirror device.

8. A micromechanical micromirror array, comprising:
a frame which includes a cutout;
a micromirror device suspended in a first plane on the frame in an area of the cutout;
a first pivoting vane device suspended on the frame in the area of the cutout, the first pivoting vane device being coupled to the micromirror device via a first spring device;
a second pivoting vane device suspended on the frame, protruding into the area of the cutout, the second pivoting vane being coupled to the micromirror device via a second spring device;
a first drive device configured to deflect the first pivoting vane device along a first axis which is situated perpendicular to the first plane; and a second drive device configured to an antiphase deflection of the second pivoting vane device along the first axis;

wherein the micromirror device is resiliently rotatable out of the first plane by the antiphase deflection of the first pivoting vane device and of the second pivoting vane device about a second axis; and wherein the first pivoting vane device and the second pivoting vane device extend beyond the second axis on a first side of the micromirror device along a direction of a third axis situated perpendicularly to the second axis, wherein the first pivoting vane device and the second pivoting vane device are each coupled on a first side of the micromirror device and on an opposite second side of the micromirror device, wherein:

the first pivoting vane device and the second pivoting vane device each encompass the micromirror device in a forked manner;

the first pivoting vane device is suspended on the frame in the first plane via a fifth spring device, extends along a direction of the third axis on both sides of the micromirror device beyond the second axis, and is connected at its ends to the micromirror device via the first spring device; and the second pivoting vane device is suspended on the frame in the first plane via a sixth spring device, extending along the direction of the third axis on both sides of the micromirror device beyond the second axis, and is connected on its ends to the micromirror device via the sixth spring device.

9. The micromechanical micromirror array as recited in claim 1, further comprising:

a third pivoting vane device suspended on the frame protruding into the area of the cutout, the third pivoting vane being coupled to the micromirror device via a third spring device;

a fourth pivoting vane device suspended on the frame protruding into the area of the cutout, the fourth pivoting vane being coupled to the micromirror device via a fourth spring device;

a third drive device configured to deflect the third pivoting vane device along a first axis, which is situated perpendicularly to the first plane; and a fourth drive device configured to an antiphase deflection of the fourth pivoting vane device along the first axis;

wherein the micromirror device is resiliently rotatable out of the first plane by the antiphase deflection of the third pivoting vane device and the fourth pivoting vane device about the second axis; and wherein the third pivoting vane device and the fourth pivoting vane device are configured in such a way that they extend beyond the second axis on a second side of the micromirror device opposite the first side, along the direction of the third axis situated perpendicularly to the second axis.

10. The micromechanical micromirror array as recited in claim 9, wherein the third pivoting vane device and the fourth pivoting vane device, the third spring device, the fourth spring device, the third drive device and the fourth drive device are symmetrically situated and coupled relative to the first side on a second side of the micromirror device opposite the first side.

11. The micromechanical micromirror array as recited in claim 1, wherein the first drive device and/or the second drive device includes a piezoelectric drive device, a piezoelectric strip conductor device being mounted on the first pivoting vane device and on the second pivoting vane device.

12. The micromechanical micromirror array as recited in claim 1, wherein the first drive device and/or the second drive device includes an electromagnetic drive device, which includes an external magnetic field generation device and a coil device, the coil device being mounted on the first pivoting vane device and on the second pivoting vane device and on the frame.

13. The micromechanical micromirror array as recited in claim 1, further comprising:

a sensor device including a plurality of piezoelectric resistors mounted on respective springs, which are attached between the frame and the first pivoting vane device and the frame and the second pivoting vane device, the sensor device configured to detect the resilient rotation of the micromirror device about the second axis out of the first plane.

14. The micromechanical micromirror array as recited in claim 1, wherein a first cap substrate including a cutout provided in the area of the micromirror device is situated on a rear side of the frame, and a second cap substrate including an optical window provided in the area of the micromirror device is situated on a front side of the frame.

15. An operating method for a micromechanical micromirror array, comprising the following steps:

providing the micromechanical mirror array, the micromechanical mirror array including a frame which includes a cutout, a micromirror device suspended in a first plane on the frame in an area of the cutout, a first pivoting vane device suspended on the frame in the area of the cutout, the first pivoting vane device being coupled to the micromirror device via a first spring device, a second pivoting vane device suspended on the frame, protruding into the area of the cutout, the second pivoting vane being coupled to the micromirror device via a second spring device, a first drive device configured to deflect the first pivoting vane device along a first axis which is situated perpendicular to the first plane, and a second drive device configured to an antiphase deflection of the second pivoting vane device along the first axis, wherein the micromirror device is resiliently rotatable out of the first plane by the antiphase deflection of the first pivoting vane device and of the second pivoting vane device about a second axis, and wherein the first pivoting vane device and the second pivoting vane device extend beyond the second axis on a first side of the micromirror device along a direction of a third axis situated perpendicularly to the second axis; and antiphase deflecting the first pivoting vane device and the second pivoting vane device;

based on the antiphase deflecting, the micromirror device resiliently rotating about the second axis out of the first plane, wherein the first pivoting vane device is suspended in a first area of the frame in the first plane, extends along a direction of the third axis beyond the second axis, and is connected at its end to a first extension of the micromirror device via the first spring device.

* * * * *